United States Patent
Adusumilli et al.

(10) Patent No.: US 11,444,149 B1
(45) Date of Patent: Sep. 13, 2022

(54) POLYSILICON RESISTOR WITH CONTINUOUS U-SHAPED POLYSILICON RESISTOR ELEMENTS AND RELATED METHOD

(71) Applicant: GLOBALFOUNDRIES U.S. Inc., Santa Clara, CA (US)

(72) Inventors: Siva P. Adusumilli, South Burlington, VT (US); Steven M. Shank, Jericho, VT (US); Yves T. Ngu, Essex Junction, VT (US); Mickey H. Yu, Essex Junction, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/182,415

(22) Filed: Feb. 23, 2021

(51) Int. Cl.
*H01L 27/12* (2006.01)
*H01L 27/06* (2006.01)
*H01L 49/02* (2006.01)
*H01L 27/08* (2006.01)

(52) U.S. Cl.
CPC .......... *H01L 28/20* (2013.01); *H01L 27/1203* (2013.01); *H01L 27/0629* (2013.01); *H01L 27/0802* (2013.01)

(58) Field of Classification Search
CPC . H01L 28/20; H01L 27/0688; H01L 27/1203; H01L 27/0802; H01L 27/0629; H01L 29/8605; H01L 29/66575
USPC .................................. 438/382; 257/538, 536
See application file for complete search history.

(56) References Cited

U.S. PATENT DOCUMENTS

| | | |
|---|---|---|
| 5,352,923 A | 10/1994 | Boyd et al. |
| 7,084,483 B2 | 8/2006 | Aitken et al. |
| 7,560,761 B2 | 7/2009 | Cheng et al. |
| 8,377,790 B2 | 2/2013 | Kanike et al. |
| 8,614,137 B2 | 12/2013 | Kemerer et al. |
| 8,735,986 B2 | 5/2014 | Botula et al. |
| 8,962,420 B2 | 2/2015 | Kurz et al. |
| 9,716,136 B1 | 7/2017 | Abou-Khalil et al. |
| 2005/0263850 A1* | 12/2005 | Aitken et al. ........... H01L 21/20 257/536 |
| 2006/0166457 A1 | 7/2006 | Liu et al. |
| 2011/0108919 A1 | 5/2011 | Chinthakindi et al. |

(Continued)

OTHER PUBLICATIONS

"Structure Including Polycrystalline Resistor With Dopant-Including Polycrystalline Region Thereunder", U.S. Appl. No. 17/036,194, filed Sep. 29, 2020.

(Continued)

*Primary Examiner* — Thinh T Nguyen
(74) *Attorney, Agent, or Firm* — Francois Pagette; Hoffman Warnick LLC

(57) ABSTRACT

A resistor includes at least one polysilicon resistor element in a semiconductor substrate with each polysilicon resistor element having a continuous U-shape with a continuous lateral bottom. The resistor may include an insulator within a valley of the U-shape of each polysilicon resistor element. A plurality of polysilicon resistor elements can be sequentially interconnected to create a serpentine polysilicon resistor. The resistor may also include a dopant-including high resistivity (HR) polysilicon layer thereunder to provide electrical isolation from, and better thermal conduction to, for example, a base semiconductor substrate. The resistor can be used in an SOI substrate. A related method is also disclosed.

19 Claims, 10 Drawing Sheets

(56) References Cited

U.S. PATENT DOCUMENTS

| | | | |
|---|---|---|---|
| 2014/0183657 A1* | 7/2014 | Lim et al. | H01L 29/66575 |
| | | | 257/380 |
| 2016/0358905 A1 | 12/2016 | Balakrishnan et al. | |
| 2018/0285509 A1* | 10/2018 | Lo et al. | H01L 28/20 |

OTHER PUBLICATIONS

Bulk Semiconductor Structure With a Multi-Level Polycrystalline Semiconductor Region And Method, U.S. Appl. No. 16/992,165, filed Aug. 13, 2020.

Field-Effect Transistors With A Polycrystalline Body In A Shallow Trench Isolation Region, U.S. Appl. No. 16/890,063, filed Jun. 2, 2020.

* cited by examiner

POLYSILICON RESISTOR WITH CONTINUOUS U-SHAPED POLYSILICON RESISTOR ELEMENTS AND RELATED METHOD

BACKGROUND

The present disclosure relates to integrated circuits (ICs), and more specifically, to polysilicon resistors having one or more continuous U-shaped polysilicon resistor elements, each with a continuous lateral bottom.

Resistors for an IC are oftentimes formed in inter-layer dielectric (ILD) layers above transistors. ILD layers provide scaling interconnects for the IC. Resistors are oftentimes formed over an oxide or shallow trench isolation (STI) in a substrate in or on which the transistors are formed, which reduces thermal dissipation from the resistor into the substrate. In addition, the resistors extend horizontally within the layers, taking up valuable area and potentially blocking access to other functional components therebelow, requiring complex electrical connections to those components or addition of more components not covered by the resistor. Trench resistors have been employed to minimize the area used by the resistors, but the approaches employed are complicated because they require formation of trenches specifically for the resistor, filling of the trenches and connection of material in the bottom of the trenches.

SUMMARY

An aspect of the disclosure is directed to a resistor, comprising: at least one polysilicon resistor element in a semiconductor substrate, each polysilicon resistor element having a continuous U-shape with a continuous lateral bottom; and an insulator within a valley of the continuous U-shape of each polysilicon resistor element.

Another aspect of the disclosure includes a resistor, comprising: a plurality of connected polysilicon resistor elements in a semiconductor-on-insulator (SOI) substrate, each polysilicon resistor element having a continuous U-shape with a continuous lateral bottom, the plurality of polysilicon resistor elements creating a serpentine polysilicon resistor, wherein the SOI substrate includes a buried insulator layer over a base semiconductor substrate; a trench isolation insulator within a valley of the continuous U-shape of each polysilicon resistor element; and a dopant-including high resistivity (HR) polycrystalline layer below the buried insulator layer and below each polysilicon resistor element in the base semiconductor substrate, wherein a dopant of the dopant-including HR polycrystalline layer includes a noble gas element; wherein each polysilicon resistor element extends through the buried insulator layer and into the dopant-including HR polycrystalline layer.

An aspect of the disclosure related to a method of forming a serpentine polysilicon resistor in, the method comprising: forming a plurality of trenches in a semiconductor-on-insulator (SOI) substrate including an active semiconductor layer over a buried insulator layer over a base semiconductor substrate, each trench extending to the base semiconductor substrate; filling each trench with a polysilicon member; forming an insulator in each polysilicon member, forming a plurality of polysilicon resistor elements each having a continuous U-shape with a continuous lateral bottom in a respective trench and with the insulator in a valley of each continuous U-shape; forming a dopant-including high resistivity (HR) polycrystalline layer below the buried insulator layer and below each polysilicon resistor element in the base semiconductor substrate, wherein a dopant of the dopant-including HR polycrystalline layer includes a noble gas element; and interconnecting ends of the plurality of polysilicon resistor elements sequentially to form the serpentine polysilicon resistor.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
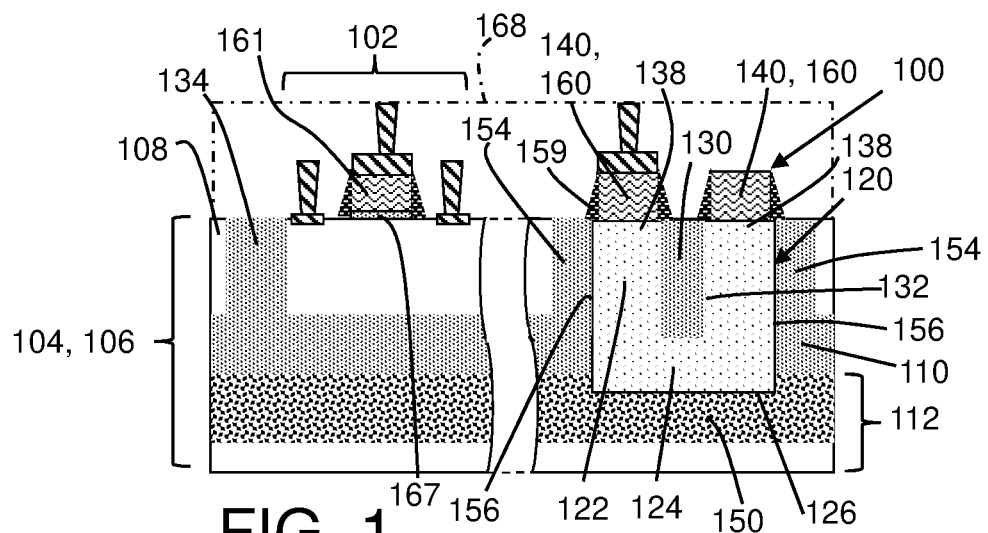
FIG. 1 shows a cross-sectional view of a resistor according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a resistor including at least one polysilicon resistor element in a semiconductor substrate with each polysilicon resistor element having a continuous U-shape with a continuous lateral bottom. The resistor may include an insulator, such as a trench isolation insulator, within a valley of the U-shape of each polysilicon resistor element. A plurality of resistor elements can be sequentially interconnected to create a serpentine polysilicon resistor. Among other things, the resistivity of the resistor can be customized based on the number of resistor elements, the dopants in the polysilicon, and the depth of the resistor elements in the semiconductor substrate. The resistor may include an insulator, such as a trench isolation insulator, in contact with outer sidewalls of the continuous U-shape of the resistor element(s) to provide additional electrical isolation. In another embodiment, the resistor may include a dopant-including high resistivity (HR) polysilicon layer thereunder to provide electrical isolation from, and better thermal conduction to, the semiconductor substrate. A dopant-including HR polysilicon region may also contact the outer sidewalls of the continuous U-shape of the resistor element(s) to provide additional electrical isolation and better thermal conduction to, for example, the semiconductor substrate. Where necessary, an insulative liner may be positioned about the resistor element(s) to provide additional electrical isolation. The resistor can be used in an SOI substrate, and formation of the resistor can be integrated with bipolar fabrication, removing the need to form trenches specifically for the resistor element(s). The resistor provides an ultra-compact programmable resistor with improved heat dissipation compared to conventional resistors. A large fraction of the resistor is vertical, which reduces its horizontal surface area, and provides much of the resistance in the vertical portions of the continuous U-shaped polysilicon resistor element(s).

Figure 2:
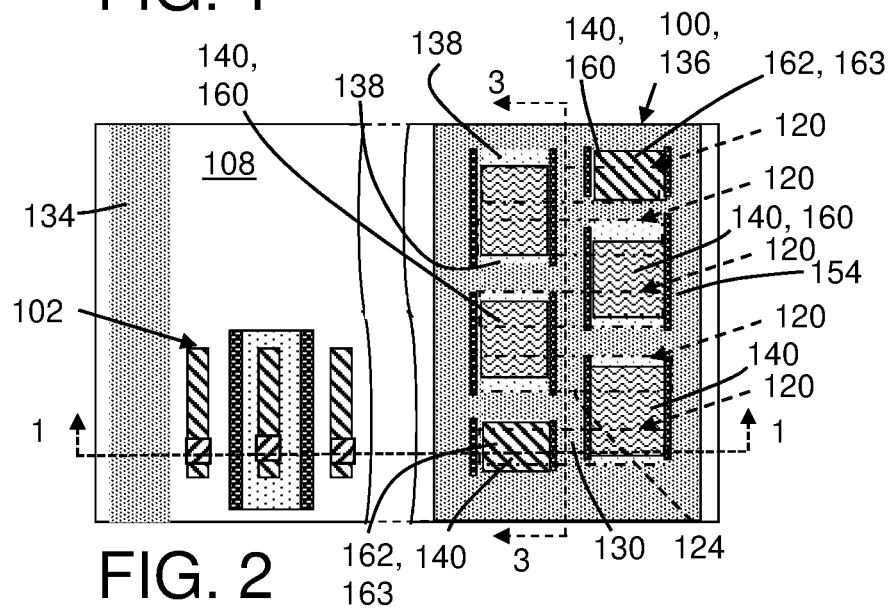
FIG. 2 shows a top down view of a resistor according to embodiments of the disclosure.
Figure 3:
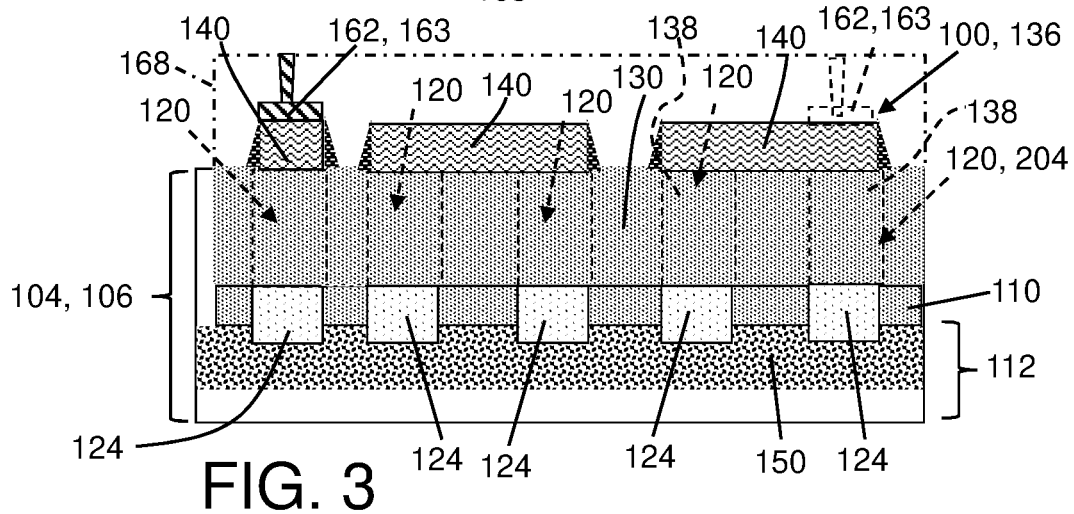
FIG. 3 shows another cross-sectional view of a resistor according to embodiments of the disclosure.

FIGS. 1-3 show views of a resistor 100 according to embodiments of the disclosure. FIG. 1 shows a cross-sectional view of a resistor 100 (see view line 1-1 in FIG. 1), FIG. 2 shows a top down view of resistor 100, and FIG. 3 shows another cross-sectional view of resistor 100 (see view line 3-3 in FIG. 2), according to embodiments of the disclosure. As illustrated, any resistor described herein can be formed adjacent a complementary metal-oxide semiconductor (CMOS) region 102 including a CMOS device(s) such as a field effect transistor(s) (FET) (shown). In some implementations, formation of resistors described herein can be integrated with formation of bipolar or CMOS devices (not shown); however, this is not necessary in all instances.

Resistor 100 described herein is formed in a semiconductor substrate 104, i.e., the resistor element(s) are not on or over the substrate. In one embodiment, semiconductor substrate 104 may include a semiconductor-on-insulator (SOI) substrate 106 including an active semiconductor layer 108 ("SOI layer 108"), an insulator layer 110 and a base semiconductor substrate 112. SOI layer 108 and base semiconductor layer 112 may include but are not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Insulator layer 110 (also referred to herein as "buried insulator layer 110") may include any appropriate dielectric such as but not limited to silicon dioxide, i.e., forming a buried oxide (BOX) layer. A portion of, or the entire, semiconductor substrate may be strained. The precise thickness of insulator layer 110 and SOI layer 108 may vary widely with the intended application. While shown in an SOI substrate 104, embodiments of the disclosure can be formed in other substrates, e.g., bulk semiconductor substrates.

Resistor 100 also includes at least one polysilicon resistor element 120 in semiconductor substrate 104. As shown best in FIG. 1, each polysilicon resistor element 120 has a continuous U-shape 122 with a continuous lateral bottom 124. That is, continuous U-shape 122 is all one piece and all one material with no discontinuities. Continuous lateral bottom 124 extends laterally, i.e., sideways on the page. The polysilicon of polysilicon resistor elements 120 can be un-doped, or it may be doped in-situ with, for example, boron (B). Doping is the process of introducing impurities (dopants) into the semiconductor substrate, or elements formed on the semiconductor substrate, and is often performed with a mask (or previously-formed, elements in place) so that only certain areas of the substrate will be doped. Usually in doping, a dopant, a dosage and an energy level are specified and/or a resulting doping level may be specified. A dosage may be specified in the number of atoms per square centimeter (atoms/cm$^2$) and an energy level (specified in keV, kilo-electron-volts), resulting in a doping level (concentration in the substrate) of a number of atoms per cubic centimeter (atoms/cm$^3$). The number of atoms is commonly specified in exponential notation, where a number like "3E15" means 3 times 10 to the 15th power, or a "3" followed by 15 zeroes (3,000,000,000,000,000). Here, polysilicon resistor elements 120 may be doped in-situ with, for example, boron (B) with a dosage of, for example, 5E15 atoms/cm$^3$ at 15 KeV. Other dopants, dosage and energy levels may also be employed. Each polysilicon resistor element 120 (hereafter "resistor element(s) 120") extends through buried insulator layer 110. Hence, outer sidewalls 156 of resistor element(s) 120 may be in direct contact with buried insulator layer 110. Resistor element(s) 120 is positioned within a trench 126 in semiconductor substrate 104. Resistor element(s) 120 may also extend partially into base semiconductor substrate 112. A depth or vertical extent of resistor element(s) 120 may be user defined, allowing customization of a resistivity value thereof by controlling a length of resistor 100. In one embodiment, as shown for example in FIG. 1, resistor element(s) 120 is more deep than wide, thus ensuring most of the resistivity provided is created by its vertical extent or depth. In one non-limiting example, at least 60% of the overall resistivity of resistor 100 may be provided by the vertical extent of resistor element(s) 120.

Resistor 100 also includes an insulator 130 within a valley 132 of continuous U-shape 122 of resistor element(s) 120. In one embodiment, insulator 130 may include a trench isolation insulator, i.e., an insulator formed along with other trench isolations 134 for other structure, such as FETs within CMOS region 102. However, insulator 130 may be formed separate from trench isolations 134, if desired. Trench isolations (TI) 134 generally include a trench etched into semiconductor substrate 104, and filled with an insulating material to isolate one region of the substrate from an adjacent region of the substrate. During this process, insulator 130 can be formed by etching a trench into a polysilicon member in trench 126, and filling the trench with an insulating material to form continuous U-shape 122 of resistor element(s) 120. One or more transistors, e.g., a FET in CMOS region 102, of a given polarity may be disposed within an area isolated by TI 134. Insulator 130 and each TI 134 may be formed of any currently-known or later developed substance for providing electrical insulation, and as examples may include: silicon nitride (Si$_3$N$_4$), silicon oxide (SiO$_2$), fluorinated SiO$_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. Insulator 130 and TIs 134 may be formed by deposition of the selected insulator material, such as by atomic layer deposition (ALD), followed by a planarization. It is recognized that insulator 130 need not be formed with trench isolations, and can be separately formed to create continuous U-shaped resistor elements 120, e.g., by appropriate trench opening in the polysilicon member in trench 126, and deposition of insulator material such as by atomic layer deposition (ALD) and planarization. As shown best in FIGS. 2 and 3, insulator 130 extends through continuous U-shape 122 such that the polysilicon of resistor element(s) 120 does not completely surround the insulator.

Resistor 100 may include a single, resistor element 120, as shown in FIG. 1.

Alternatively, as shown in FIGS. 2-3, resistor 100 may include a plurality of polysilicon resistor elements 120 sequentially coupled together, creating a serpentine polysilicon resistor 136. As shown in FIGS. 2-3, ends 138 of plurality of resistor elements 120, i.e., ends of continuous U-shape, are sequentially coupled together by at least one conductive connector 140. Each conductive connector 140 couples one end 138 of a resistor element 120 (in dashed lines in FIGS. 2-3) to another end 138 of an adjacent resistor element 120. Conductive connectors 140 do not necessarily perfectly match the shape of ends 138 of resistor elements 120; hence, ends 138 appear in some locations, but not in others in FIG. 2. In any event, in this manner, any number of U-shaped resistor elements 120 can be coupled together to form serpentine resistor 136 of any desired length, and hence, any desired resistivity value. In FIG. 2, serpentine resistor 136 turns sinusoidally up and down the page and also into and out of the page. In FIGS. 2 and 3, five (5) resistor elements 120 are sequentially coupled together; however any number may be used. It is noted that resistor elements 120 are shown in dashed lines in FIG. 2 because insulator 130 and conductive connectors 140 cover the elements, and in FIG. 3, the tops of resistor elements 120 are shown in dashed lines because view line 3-3 (FIG. 2) cuts through insulator 130. Conductive connectors 140 are shown in an interconnect layer 168 (dashed box), e.g., a dielectric layer, throughout the disclosure. As understood in the art, other connectors such as contacts may also be employed.

Resistor 100 may also include a dopant-including high resistivity (HR) polycrystalline layer 150 below each resistor element 120 in semiconductor substrate 104. A dopant of HR polycrystalline layer 150 may include a noble gas element, e.g., argon (Ar), xenon (Xe), helium (He), krypton (Kr), and/or neon (Ne). In one non-limiting example, the dopant may include Ar. As illustrated, resistor 100 may also include insulator layer 110 above dopant-including HR polycrystalline layer 150. As illustrated best in FIGS. 1 and 3, each resistor element 120 extends through buried insulator layer 110 and into base semiconductor substrate 112 and, more particularly, into dopant-including HR polycrystalline layer 150. HR polycrystalline layer 150 provides additional electrical isolation to contain any current leakage to, for example, base semiconductor substrate 112. HR polycrystalline layer 150 also provides better thermal conductivity from resistor 100 into, for example, base semiconductor substrate 112 compared to other insulators. While shown under CMOS region 102, HR polycrystalline layer 150 can be formed in any location, or omitted from any location, e.g., using appropriate masks during the ion implanting used to create layer 150.

In certain embodiments, as shown best in FIGS. 1 and 2, each insulator 130 may be a trench isolation insulator, and is formed with trench isolations 134 such that an insulator 154 also contacts outer sidewalls 156 of continuous U-shape 122 of each resistor element 120. Insulator 154 assists in preventing current leakage to, for example, semiconductor substrate 104. As shown in FIG. 2, in this embodiment, insulator 130 and insulator 154 surround continuous U-shaped resistor elements 120 on all sidewalls of the vertical portions thereof.

Conductive connectors 140 can take a variety of forms. In certain embodiments, as shown in FIGS. 1-3, conductive connectors 140 may each include a polysilicon connector 160. Here, each polysilicon connector 160 may be in the same layer as a poly-conductor layer 162 (FIG. 1) of an adjacent CMOS region 102. Poly-conductor layer 162 may include any polysilicon of FET gates spanning source/drain regions of CMOS device(s). The use of polysilicon connectors 160 may require an additional masking step to remove gate dielectric layer 167 (FIGS. 1, 4, 7, 10, 12) that is formed for devices in CMOS region 102. Each polysilicon connector 160 may have a nitride spacer 159 (labeled in FIG. 1 only) adjacent thereto.

Resistor 100 may also include a silicide layer 163 over at least one of polysilicon connector(s) 160. In FIGS. 2-3, endmost conductive connectors 162 of serpentine resistor 136 are the only polysilicon connectors 160 including silicide layer 163 thereon. Silicide layer 163 may not cover all of ends 138 of resistor elements 120; hence some of ends 138 of resistor elements 120 are viewable in the FIG. 2 top down view.

Figure 4:
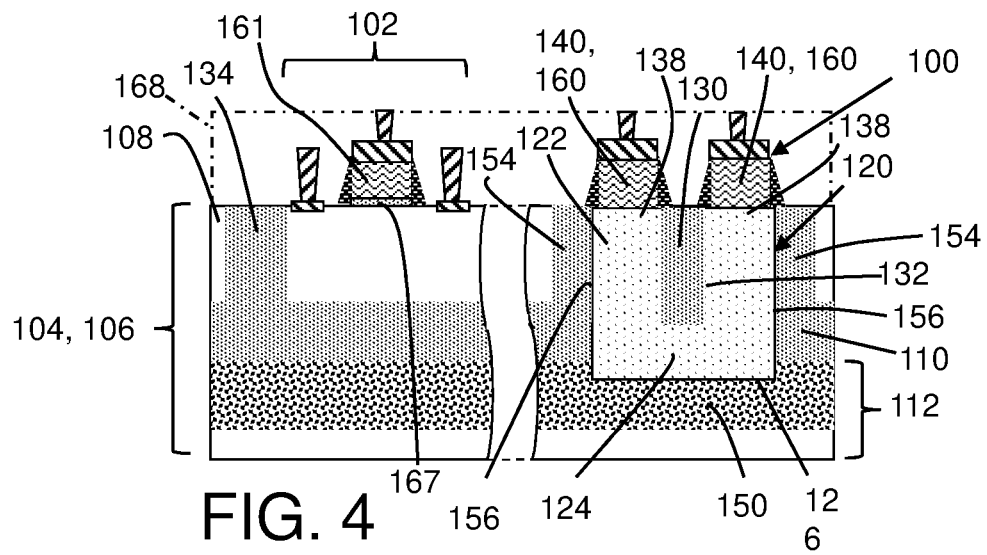
FIG. 4 shows a cross-sectional view of a resistor according to other embodiments of the disclosure.
Figure 5:
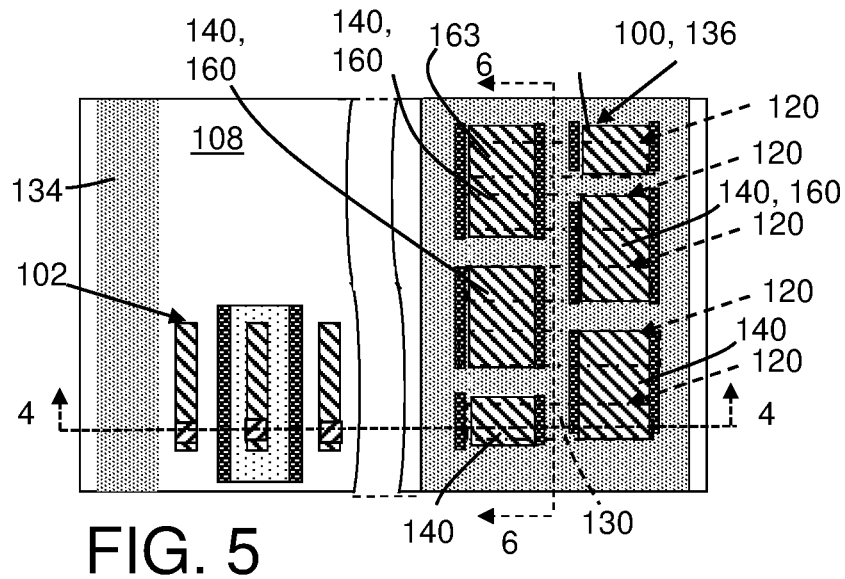
FIG. 5 shows a top down view of a resistor according to other embodiments of the disclosure.
Figure 6:
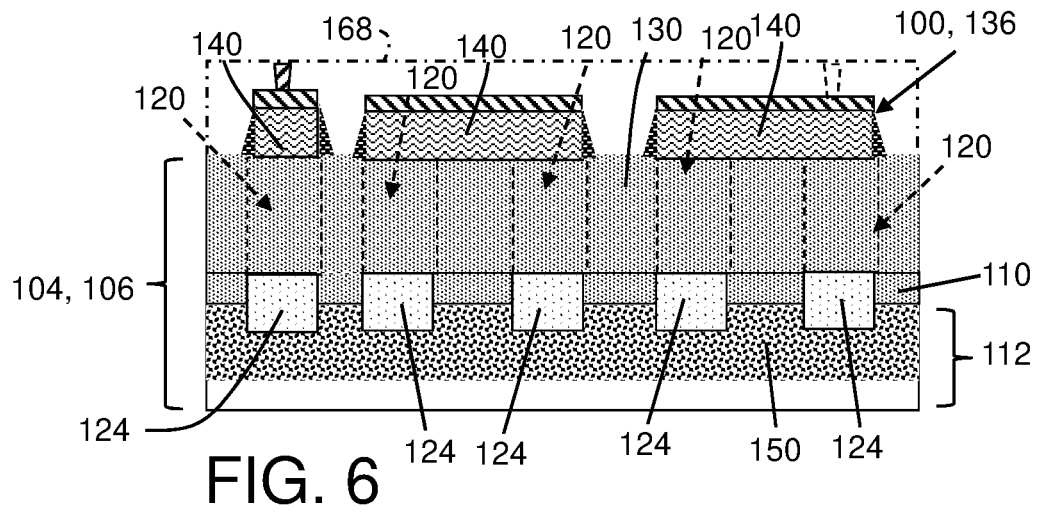
FIG. 6 shows another cross-sectional view of a resistor according to other embodiments of the disclosure.

FIGS. 4-6 show views of a resistor 100 according to alternative embodiments of the disclosure. More specifically, FIG. 4 shows a cross-sectional view (view line 4-4 in FIG. 5), similar to FIG. 1; FIG. 5 shows a top down view, similar to FIG. 2; and FIG. 6 shows a cross-sectional view along view line 6-6 in FIG. 5, of alternative embodiments of conductive connectors 140. Here, conductive connectors 140 include polysilicon, as in FIGS. 1-3, but all polysilicon connectors 160 include a silicide layer 163 thereon. Here, silicide layer 163 covers all of ends 138 (FIG. 4) of resistor elements 120. Silicide may be formed using any now known or later developed technique with or without masks, e.g., performing an in-situ pre-clean, depositing a metal such as titanium, nickel, cobalt, etc., annealing to have the metal react with the polysilicon, and removing unreacted metal.

Figure 7:
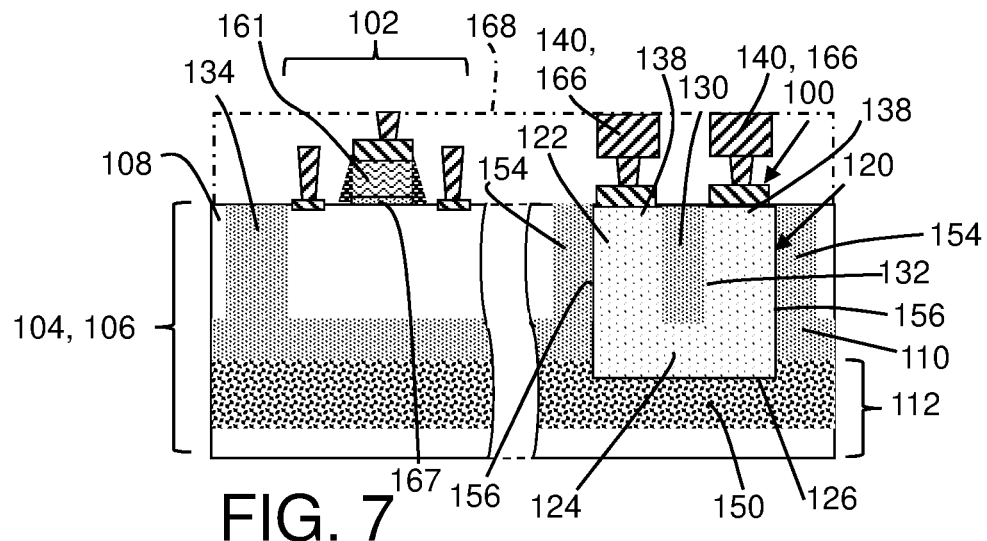
FIG. 7 shows a cross-sectional view of a resistor according to another embodiment of the disclosure.
Figure 8:
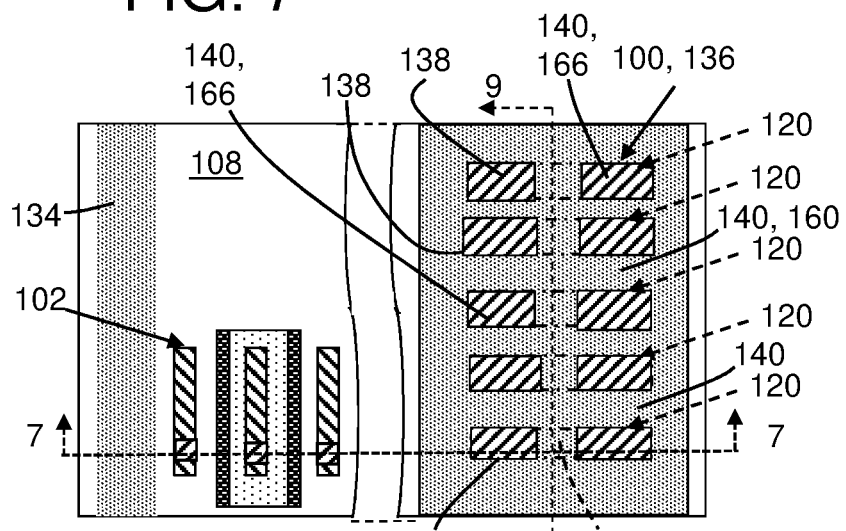
FIG. 8 shows a top down view of a resistor according to another embodiment of the disclosure.
Figure 9:
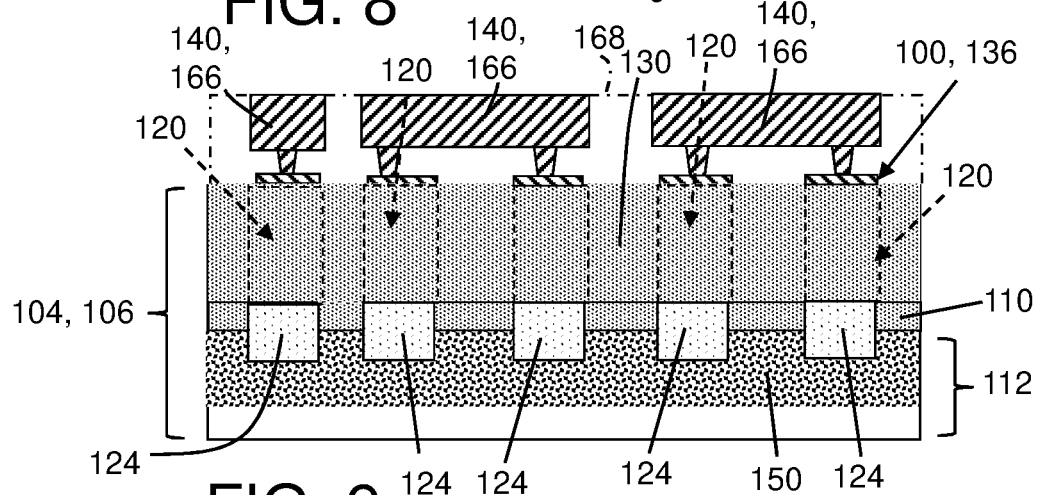
FIG. 9 shows another cross-sectional view of a resistor according to another embodiment of the disclosure.

FIGS. 7-9 show views of a resistor 100 according to other embodiments of the disclosure. More specifically, FIG. 7 shows a cross-sectional view (view line 7-7 in FIG. 8), similar to FIGS. 1 and 4; FIG. 8 shows a top down view, similar to FIGS. 2 and 5; and FIG. 9 shows a cross-sectional view along view line 9-9 in FIG. 8, of alternative embodiments of conductive connectors 140. In these embodiments, plurality of resistor elements 120 are sequentially coupled together by at least one metal connector 166 in interconnect layer 168 (dashed box) over semiconductor substrate 104. That is, conductive connectors 140 include a conventional metal connector 166, e.g., a silicide layer with a contact via with metal wire in an interlayer dielectric of interconnect layer 168. Hence, metal connector 166 may be advantageous because they can be formed during conventional MOL and/or BEOL processing. In addition, the use of polysilicon connectors 160, as in FIGS. 1-6, may require an additional masking step to remove gate dielectric layer 167 (FIGS. 1, 4, 7, 10, 12) that is formed for devices in CMOS region 102. Use of metal connectors 166 avoids this additional step. Regardless of conductive connector 140 form, any manner of vertical contacts can be used, as necessary.

Figure 10:
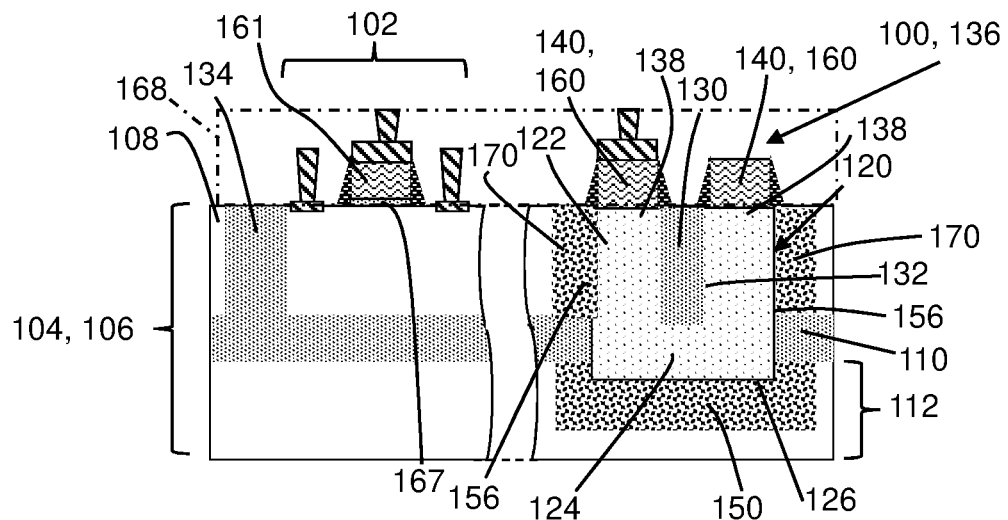
FIG. 10 shows a cross-sectional view of a resistor according to other embodiments of the disclosure.
Figure 11:
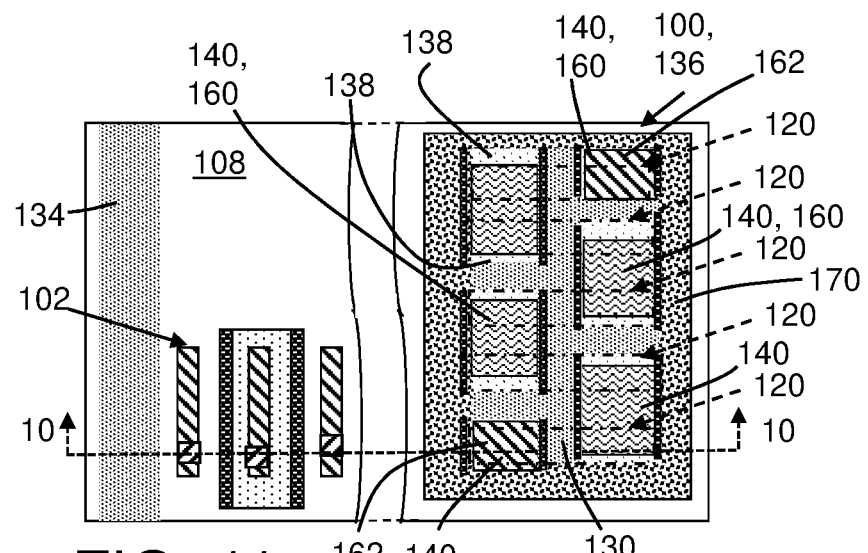
FIG. 11 shows a top down view of a resistor according to other embodiments of the disclosure.
Figure 12:
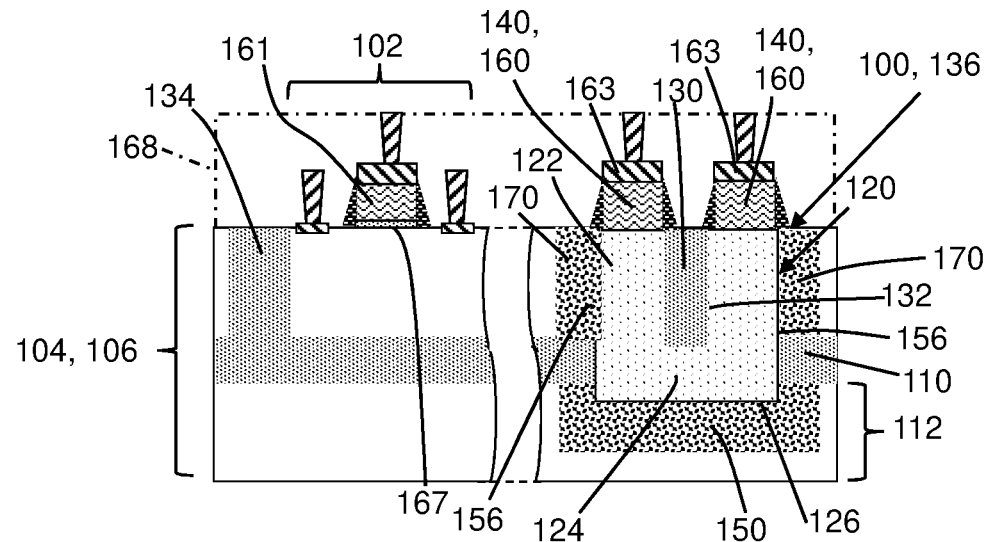
FIG. 12 shows a cross-sectional view of a resistor according to other embodiments of the disclosure.
Figure 13:
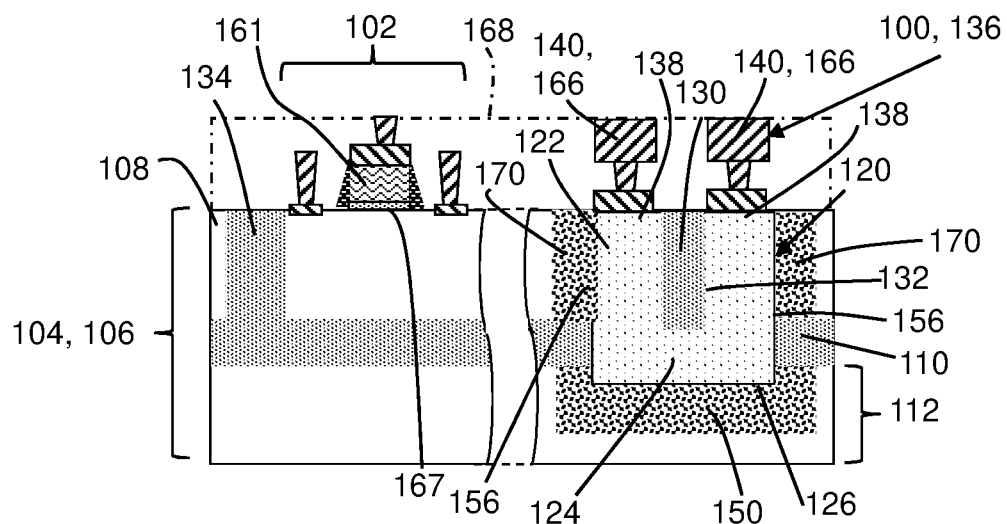
FIG. 13 shows a cross-sectional view of a resistor according to other embodiments of the disclosure.

Referring to FIGS. 10-13, in other embodiments, a dopant-including high resistivity (HR) polycrystalline region 170 surrounds outer sidewalls 156 of continuous U-shape 122 of each resistor element 120, rather than insulator 154 (FIG. 1) along outer sidewalls 156 of resistor elements 120. Here also, dopant-including HR polycrystalline layer 150 is formed only under resistor elements 120, i.e., it is not under CMOS region 102. FIG. 10 shows a cross-sectional view (view line 10-10 in FIG. 11); and FIG. 11 shows a top down view, of such embodiments. As shown in FIG. 11, insulator 130 is in valleys 132 of continuous U-shapes 122, and between adjacent resistor elements 120. FIGS. 10 and 11 are shown with polysilicon conductors 160 with only endmost conductive connectors 162 having silicide thereon. It is noted, however, that the FIGS. 10 and 11 embodiments can use any form of conductive connector 140 described herein. FIG. 12 shows a cross-sectional view of the FIG. 10 embodiment with silicided polysilicon conductors 160 (with silicide layer 163) as in FIGS. 1-6, and FIG. 13 shows a cross-sectional view of the FIG. 10 embodiment with metal connectors 166 as in FIGS. 7-9. Dopant-including HR polysilicon region 170 may be advantageous compared to insulator 154 (FIGS. 1-6) because it has a higher thermal conductivity than insulator 154, and thus may provide improved thermal dissipation from resistor 100 to, for example, semiconductor substrate 104.

Figure 14:
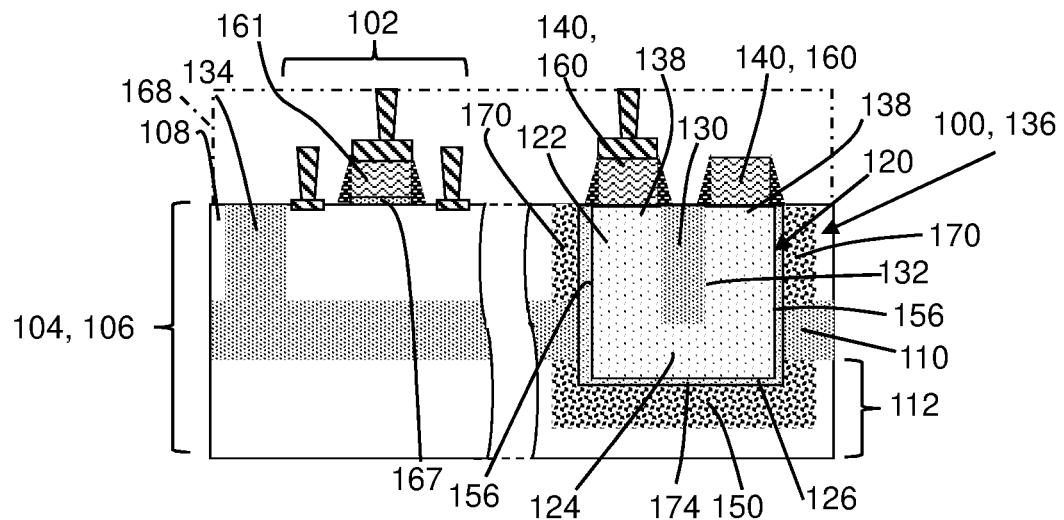
FIG. 14 shows a cross-sectional view of a resistor according to yet another embodiment of the disclosure.
Figure 15:
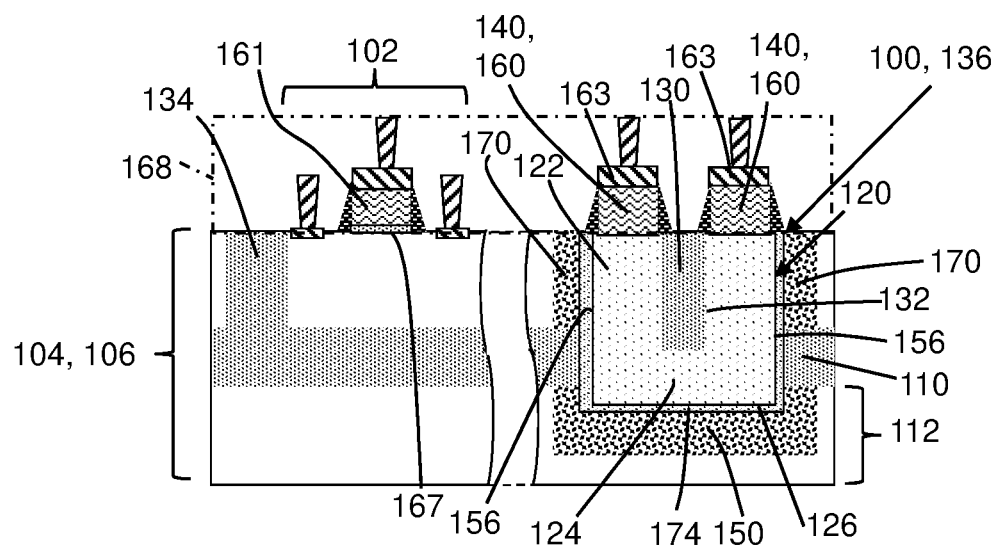
FIG. 15 shows a cross-sectional view of a resistor according to yet another embodiment of the disclosure.

Referring to FIGS. 14-17, another embodiment of resistor 100, 136 is shown. FIG. 14 shows a cross-sectional view. Here, resistor 100 is substantially similar to the FIGS. 10-13 embodiment, except each polysilicon resistor element 120 is positioned within trench 126 in semiconductor substrate 104 and an insulative liner 174 lines the trench. Insulative liner 174 may include any material listed herein for insulator 130, e.g., oxide. Insulative liner 174 may be provided where, for example, electrical noise from resistor 100 going into semiconductor substrate 104 is a concern. Insulative liner 174 may reduce current leakage and improve noise isolation. Insulative liner 174 thus may provide a compromise between additional thermal conductivity from dopant-including HR polycrystalline region 170, and additional leakage/noise prevention from an insulator (similar to insulator 154 in FIG. 1 contacting outer sidewalls 156 of continuous U-shape 122 of each resistor element 120). It is noted that formation of insulative liner 174 may require use of an additional mask to prevent the liner from forming where it is not wanted. FIG. 14 is shown with polysilicon conductors 160 with only endmost conductive connectors 162 having silicide thereon. It is noted, however, that the FIG. 14 embodiment can use any form of conductive connector 140 described herein. FIG. 15 shows the FIG. 14 embodiment with silicided polysilicon conductors 162 as in FIGS. 1-6 and 12, and FIG. 16 shows the FIG. 14 embodiment with or metal connectors 166 as in FIGS. 7-9.

Figure 17:
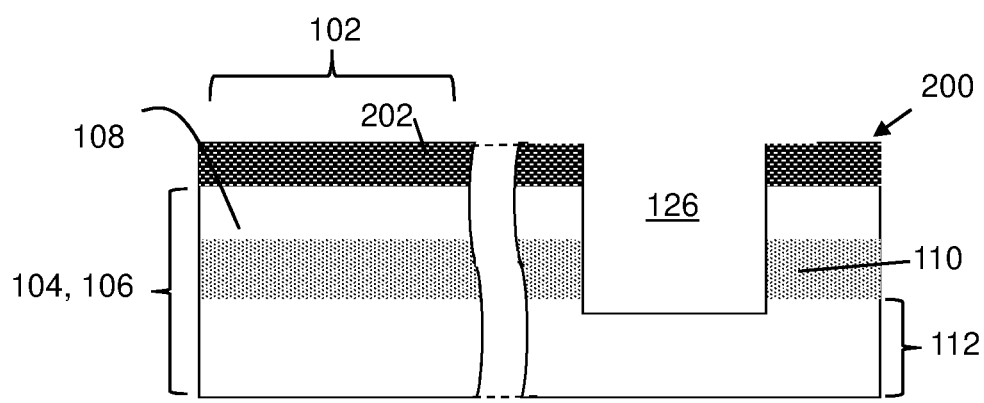
FIG. 17 shows a cross-sectional view of a preliminary structure of a method for forming a resistor according to embodiments of the disclosure.
Figure 18:
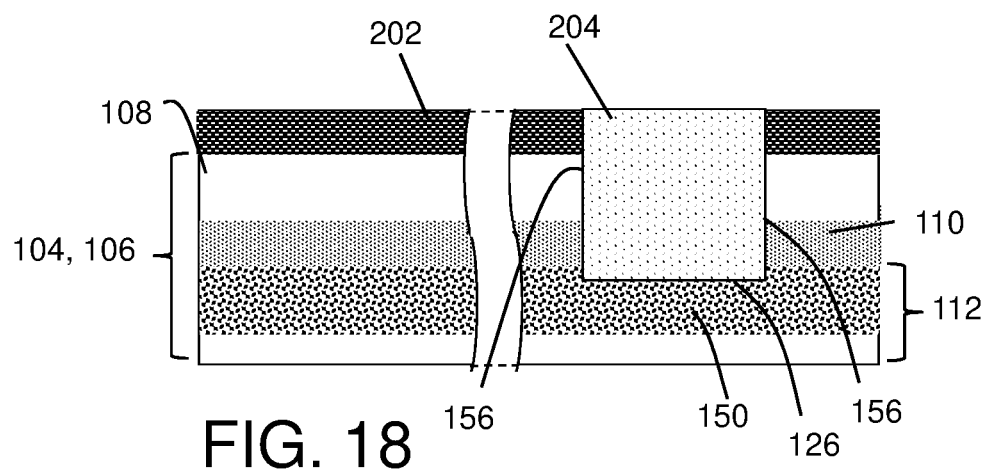
FIG. 18 shows a cross-sectional view of forming a polysilicon member for the method for forming a resistor according to embodiments of the disclosure.
Figure 19:
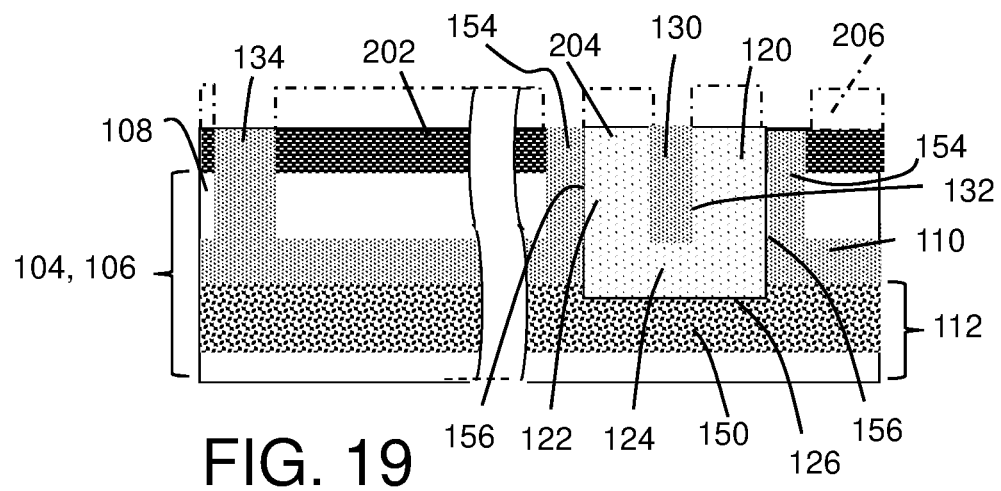
FIG. 19 shows a cross-sectional view of forming a polysilicon resistor element(s) for the method for forming a resistor according to embodiments of the disclosure.
Figure 20:
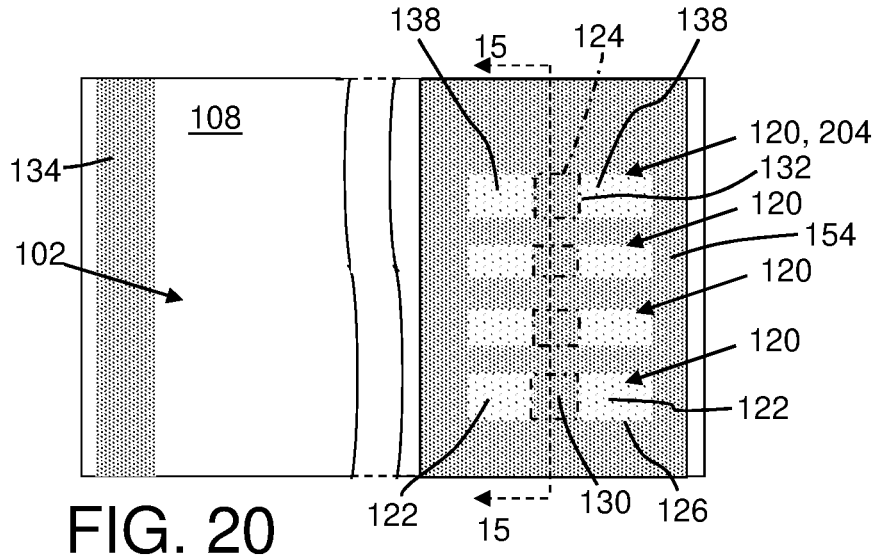
FIG. 20 shows a top down view of after forming the polysilicon resistor elements of the method for forming a resistor according to embodiments of the disclosure.

Referring to FIG. 17-24, a method of forming resistor 100 and, in particular, serpentine polysilicon resistor 136, will be described. FIG. 17 shows a cross-sectional view of a preliminary structure 200 including semiconductor substrate 104. In the example shown, semiconductor substrate 104 includes SOI substrate 106 including active semiconductor layer 108 over buried insulator layer 110 over base semiconductor substrate 112. Semiconductor substrate 104 may include a designated CMOS region 102, and a region for resistor 100 (to the right of CMOS region 102 as illustrated). FIG. 17 also shows forming a plurality of trenches 126 in semiconductor substrate 104. Trenches 126 are spaced into and out of the page of FIG. 17, e.g., see locations of resistor elements 120 in FIG. 2 and FIG. 20. Trenches 126 may be formed using any now known or later developed mask 202, e.g., by depositing and patterning the mask, and etching. Any number of trenches 126 can create any number of resistor elements 120 (FIGS. 19-20). FIG. 20 shows four (4) resistor elements 120, but one, two, three, or more than four can be used. Mask 202 may include, for example, pad nitride films. Trenches 126 may be formed as part of bipolar CMOS structure formation in other parts of semiconductor substrate 204, e.g., trenches for bipolar transistor structures, thus removing the need to form trenches specifically for resistor 100. Mask 202 may be removed using any now known or later developed techniques, e.g., an ashing process.

FIG. 18 shows a cross-sectional view of forming a polysilicon member 204 in each trench 126, FIG. 19 shows the structure after forming trench isolations, and FIG. 20 shows a top down view of the structure of FIG. 19, but after removal of mask 202. FIG. 18 shows filling each trench 126 with polysilicon member 204. Polysilicon member 104 may be formed by any appropriate deposition technique, e.g., ALD, and planarization, e.g., chemical mechanical polishing (CMP). Polysilicon member 104 can be undoped or it may be doped in-situ with, for example, boron (B). Here, polysilicon member 104 may be doped with, for example, boron (B) with a dosage of, for example, 5E15 atoms/cm$^3$ at 15 KeV. Other dopants, dosage and energy levels may also be employed.

FIGS. 19 and 20 show forming insulator 130 in each polysilicon member 204, forming a plurality of polysilicon resistor elements 120 each having continuous U-shape 122 with continuous lateral bottom 124 in respective trenches 126, and with insulator 130 in valley 132 of each continuous U-shape 122. Here, insulator 130 may be formed by etching a trench, i.e., valley 132, into each polysilicon member 204 using a mask 206 (dashed lines in FIG. 19). Mask 206 may be part of a trench isolation mask (i.e., for trench isolation 134), or a separate mask. As shown in FIGS. 3 and 20, insulator 130 extends through polysilicon members 204 (shown as resistor elements 120 in FIG. 3), bifurcating polysilicon members 204 to form continuous U-shaped resistor elements 120.

FIGS. 19-20 show formation of the FIGS. 1-6 embodiments. Here, insulator 130 is shown as formed with trench isolation 134. That is, each insulator 130 is a trench isolation insulator, and is formed with trench isolations 134 such that insulator 154 thereof also contacts outer sidewalls 156 of continuous U-shape 122 of each resistor element 120. That is, forming insulator 130 in each polysilicon member 204 also includes forming insulator 154 to contact outer sidewalls 156 of continuous U-shape 122 of each polysilicon resistor element 120. As noted, insulator 154 assists in preventing current leakage to, for example, semiconductor substrate 104. It is noted that the same processing may occur in CMOS region 102.

FIG. 19 also shows forming a dopant-including HR polycrystalline layer 150 below buried insulator layer 110 and below each polysilicon resistor element 120 in base semiconductor substrate 112. A dopant of HR polycrystalline layer 150 may include a noble gas element, e.g., argon (Ar), xenon (Xe), helium (He), krypton (Kr), and/or neon (Ne). In one non-limiting example, the dopant may include Ar. Layer 150 may be formed by, for example, ion implantation of the noble gas element. While shown under each resistor element 120, it is understood that masking may be employed to selectively create dopant-including HR layer 150 under only desired resistor elements 120.

After the above steps, as shown in FIG. 20, mask 206 may be removed using any now known or later developed techniques, e.g., an ashing process.

Returning FIGS. 2, 3, 5, 6, 8 and 9, the method may also include interconnecting ends 138 of plurality of polysilicon resistor elements 120 sequentially to form serpentine polysilicon resistor 136. Ends 138 may be interconnected by forming any of the herein described conductive connectors 140. For example, silicided polysilicon conductors as in FIGS. 1-6, or metal connectors 166 as in FIGS. 7-9. Polysilicon connectors 160 may be formed by depositing polysilicon, then patterning the polysilicon to form the connectors, perhaps simultaneously with forming of polyconductor 161 (FIG. 1) in adjacent CMOS region 102. Any necessary silicidation, and BEOL and/or MOL processing can follow to create interconnects to other layers. For example, in FIG. 2, endmost conductive connectors 162 are the only polysilicon connectors 160 including silicide layer 163 thereon. In another example, shown in FIGS. 5 and 6, all polysilicon connectors 160 may include silicide layer 163 thereon. In the other embodiment, shown in FIGS. 7-9, metal connectors 166 may be employed. Metal connectors 166 may be formed using any well known process, the details of which are well known to those with skill in the art.

Figure 21:
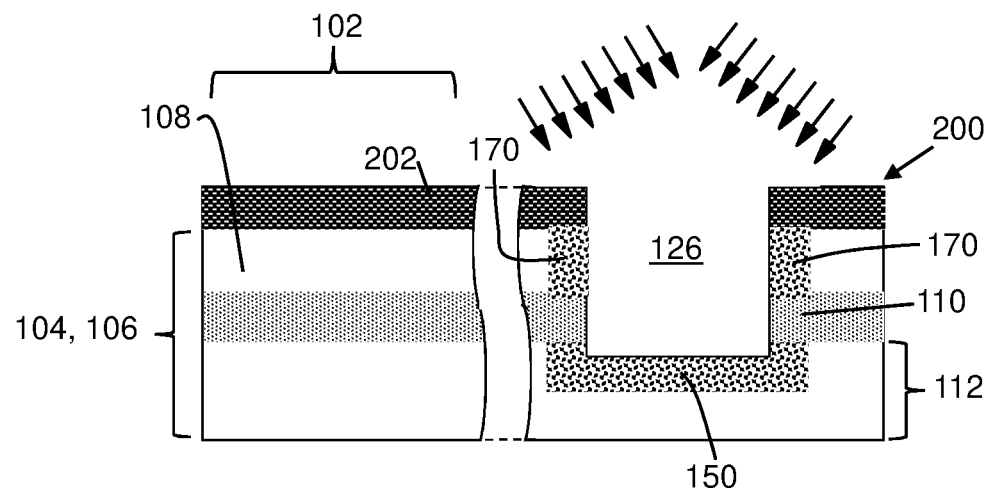
FIG. 21 shows a cross-sectional view of a doping step of the method for forming a resistor according to alternative embodiments of the disclosure.
Figure 22:
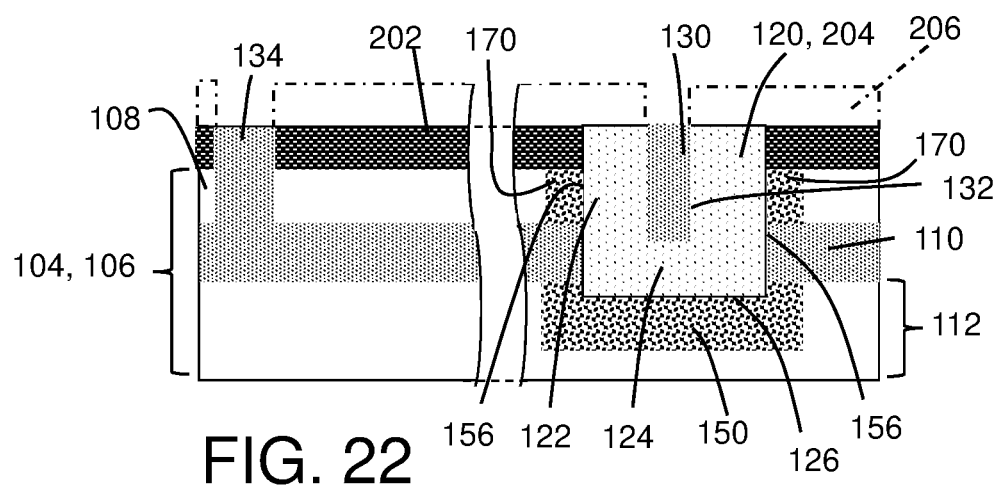
FIG. 22 shows a cross-sectional view of a number of steps of the method for forming a resistor according to alternative embodiments of the disclosure.

Referring to FIG. 21, a cross-sectional view of a preliminary structure 200, substantially similar to that of FIG. 17, is shown. FIG. 21 shows forming of dopant-including HR polysilicon region 170, as in FIGS. 10-13. Here, in order to create dopant-including HR polysilicon region 170, an ion implant is performed into trench 126, i.e., prior to forming polysilicon member 204 therein. As noted, the dopant implanted may include a noble gas element, e.g., argon (Ar), xenon (Xe), helium (He), krypton (Kr), and/or neon (Ne). In one non-limiting example, the dopant may include Ar. Any appropriate dosage and energy level may be employed. The ion implant forms dopant-including HR polycrystalline layer 150 under trench 126 and into semiconductor substrate 104, and forms dopant-including HR polycrystalline region 170 in active semiconductor layer 108 adjacent sidewalls of trench 126. As shown in the cross-sectional view of FIG. 22, when trench 126 is filled with polysilicon member 204 as previously described, outer sidewalls 156 of continuous U-shape 122 of each polysilicon resistor element 120 are contacted by dopant-including HR polysilicon region 170. FIG. 22 also shows forming insulator 130 in each polysilicon member 204 (as previously described herein), thus forming continuous U-shape 122 of each polysilicon resistor element 120.

Figure 23:
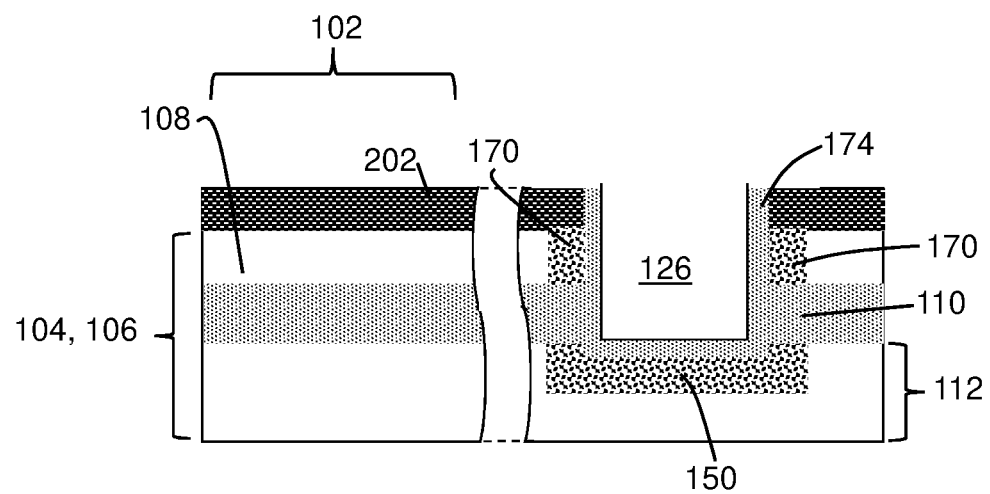
FIG. 23 shows a cross-sectional view of forming an insulative liner for the method for forming a resistor according to other embodiments of the disclosure.
Figure 24:
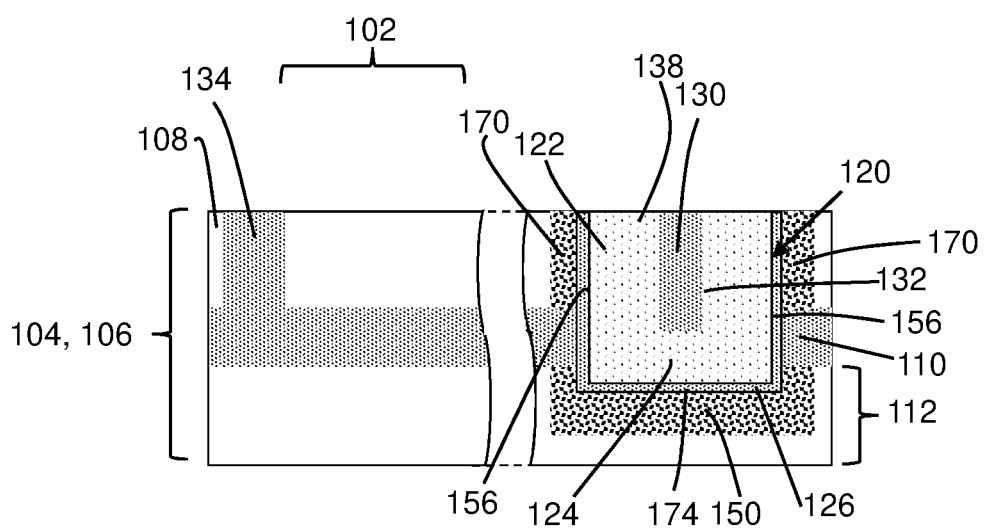
FIG. 24 shows a cross-sectional view of a number of steps of the method for forming a resistor according to other embodiments of the disclosure.

FIGS. 23 and 24 show the same process as described relative to FIGS. 21 and 22, but also including forming insulative liner 174 in each trench 126 prior to forming polysilicon member 204 in each trench. FIG. 23 shows forming of insulative liner 174 after ion implanting of dopant-including HR polycrystalline layer 150 and dopant-including HR polysilicon region 170. Insulative liner 174 may be formed using any appropriate deposition technique, e.g., ALD. It is noted that an additional mask (not shown) may be required to prevent insulative liner 174 from forming where not desired, e.g., over CMOS region 102. Resistor elements 120 in the FIGS. 23 and 24 embodiment can be interconnected, as described herein, with conductive connectors 140 see e.g., FIGS. 14-16.

Figure 16:
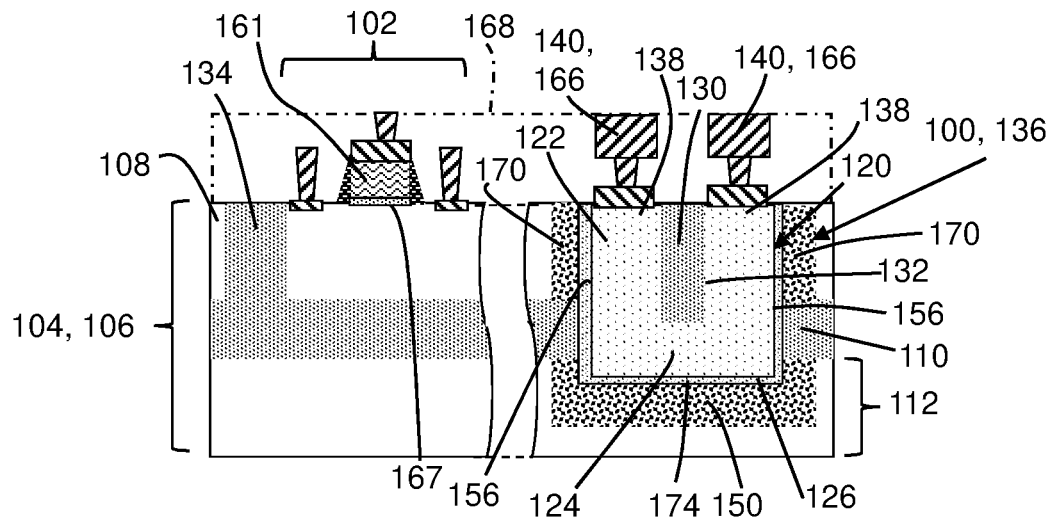
FIG. 16 shows a cross-sectional view of a resistor according to yet another embodiment of the disclosure.

Embodiments of the disclosure provide a resistor 100, including a serpentine trench resistor 136 that is compact and programmable. The resistivity of resistor 100 can be customized by, for example, the number of resistor elements 120 used, the depth of each resistor element 120, and the dopants in resistor elements 120. In one non-limiting example, at least 60% of the overall resistivity of resistor 100 may be provided by the vertical extents of resistor elements 120. Since a large portion of the resistivity is provided in the vertical portion of continuous U-shaped resistor elements 120, resistor 100 has a smaller footprint and requires less effort to work around, e.g., to access structures below it in semiconductor substrate 104. The polysilicon of resistor 100 can be form as part of BI-CMOS polysilicon and CMOS poly-conductor polysilicon, which saves time and costs by not having to form trenches explicitly for the resistor. The thermal conductivity and electrical isolation can be customized based on the thickness and type of insulation 154 (FIGS. 1-9), and/or the thickness, dopant type and dopant concentration of dopant-including HR polysilicon region 170 (e.g., FIGS. 10-13). Additional electrical and noise isolation and thermal conductivity customization for embodiments using dopant-including HR polysilicon region 170 (e.g., FIGS. 10-13) can be provided using insulative liner 174 (FIGS. 14-16). In addition, the current leakage and thermal conductivity from resistor 100 into, for example, semiconductor substrate 104 can be controlled based on a thickness, dopant type and dopant concentration of dopant-including HR polycrystalline layer 150.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A resistor, comprising:
at least one polysilicon resistor element in a semiconductor substrate and above a first portion of a dopant-including high resistivity (HR) polycrystalline layer, each polysilicon resistor element having a continuous U-shape with a continuous lateral bottom; and
a first insulator above the dopant-including HR polycrystalline layer, wherein each polysilicon resistor element extends through the first insulator and into the dopant-including HR polycrystalline layer; and
a second insulator within a valley of the continuous U-shape of each polysilicon resistor element.

2. The resistor of claim 1, wherein a dopant of the dopant-including HR polycrystalline layer includes a noble gas element.

3. The resistor of claim 2, further comprising a dopant-including high resistivity (HR) polycrystalline region surrounding outer sidewalls of the continuous U-shape of each polysilicon resistor element.

4. The resistor of claim 3, wherein each polysilicon resistor element is positioned within a trench in the semiconductor substrate having an insulative liner therein.

5. The resistor of claim 1, wherein each insulator is a trench isolation that also contacts outer sidewalls of the continuous U-shape of each polysilicon resistor element.

6. The resistor of claim 1, further comprising a plurality of polysilicon resistor elements sequentially coupled together, creating a serpentine polysilicon resistor.

7. The resistor of claim 6, wherein ends of the plurality of polysilicon resistor elements are sequentially coupled together by at least one polysilicon connector, wherein each polysilicon connector is in a same layer as a poly-conductor layer of an adjacent CMOS region; and a silicide layer over at least one of the at least one polysilicon connector.

8. The resistor of claim 6, wherein the plurality of polysilicon resistor elements are sequentially coupled together by at least one metal connector in an interconnect layer over the semiconductor substrate.

9. The resistor of claim 1, wherein each element is more deep than wide.

10. A resistor, comprising:
   a plurality of connected polysilicon resistor elements in a semiconductor-on-insulator (SOI) substrate, each polysilicon resistor element having a continuous U-shape with a continuous lateral bottom, the plurality of polysilicon resistor elements creating a serpentine polysilicon resistor, wherein the SOI substrate includes a buried insulator layer over a base semiconductor substrate;
   a trench isolation insulator within a valley of the continuous U-shape of each polysilicon resistor element; and
   a dopant-including high resistivity (HR) polycrystalline layer below the buried insulator layer and below each polysilicon resistor element in the base semiconductor substrate, wherein a dopant of the dopant-including HR polycrystalline layer includes a noble gas element, wherein each polysilicon resistor element extends through the buried insulator layer and into the dopant-including HR polycrystalline layer.

11. The resistor of claim 10, further comprising a dopant-including high resistivity (HR) polycrystalline region surrounding outer sidewalls of the continuous U-shape of each polysilicon resistor element.

12. The resistor of claim 11, wherein each polysilicon resistor element is positioned within a trench in the SOI substrate having an insulative liner therein.

13. The resistor of claim 10, wherein the trench isolation insulator also contacts outer sidewalls of the continuous U-shape of each polysilicon resistor element.

14. The resistor of claim 10, wherein ends of the plurality of polysilicon resistor elements are sequentially coupled together by at least one polysilicon connector, wherein each polysilicon connector is in a same layer as a poly-conductor layer of an adjacent CMOS region; and
a silicide layer over at least one of the at least one polysilicon connector.

15. The resistor of claim 10, wherein the plurality of polysilicon resistor elements are sequentially coupled together by at least one metal connector in an interconnect layer over the base semiconductor substrate.

16. A method of forming a serpentine polysilicon resistor, the method comprising:
   forming a plurality of trenches in a semiconductor-on-insulator (SOI) substrate including an active semiconductor layer over a buried insulator layer over a base semiconductor substrate, each trench extending to the base semiconductor substrate;
   filling each trench with a polysilicon member;
   forming an insulator in each polysilicon member, forming a plurality of polysilicon resistor elements each having a continuous U-shape with a continuous lateral bottom in a respective trench and with the insulator in a valley of each U-shape;
   forming a dopant-including high resistivity (HR) polycrystalline layer below the buried insulator layer and below each polysilicon resistor element in the base semiconductor substrate, wherein a dopant of the dopant-including HR polycrystalline layer includes a noble gas element, and wherein each polysilicon resistor element extends through the buried insulator layer and into the dopant-including HR polycrystalline layer; and
   interconnecting ends of the plurality of polysilicon resistor elements sequentially to form the serpentine polysilicon resistor.

17. The method of claim 16, wherein forming the dopant-including HR polycrystalline layer includes forming a dopant-including high resistivity (HR) polycrystalline region surrounding outer sidewalls of the continuous U-shape of each polysilicon resistor element.

18. The method of claim 16, wherein forming the insulator in each polysilicon member also includes forming the insulator to contact outer sidewalls of the continuous U-shape of each polysilicon resistor element.

19. The method of claim 16, further comprising forming an insulative liner in each trench prior to forming the polysilicon member in each trench.

* * * * *